United States Patent [19]

Oda et al.

[11] Patent Number: 5,086,409
[45] Date of Patent: Feb. 4, 1992

[54] RECORDING AND/OR REPRODUCING METHOD OF BLOCH LINE MEMORY

[75] Inventors: Hitoshi Oda; Takeo Ono, both of Yokohama; Kou Yoneda, Kawasaki; Toyoshige Sasaki, Funabashi; Mamoru Miyawaki, Tokyo, all of Japan

[73] Assignee: Canon Kabushiki Kaisha, Tokyo, Japan

[21] Appl. No.: 660,260

[22] Filed: Feb. 26, 1991

Related U.S. Application Data

[63] Continuation of Ser. No. 298,333, Jan. 17, 1989, abandoned, which is a continuation of Ser. No. 800,770, Nov. 22, 1985, abandoned.

[30] Foreign Application Priority Data

| Nov. 30, 1984 | [JP] | Japan | 59-253331 |
| Nov. 30, 1984 | [JP] | Japan | 59-253332 |
| Nov. 30, 1984 | [JP] | Japan | 59-253333 |
| Dec. 11, 1984 | [JP] | Japan | 59-261653 |

[51] Int. Cl.$^5$ ............................................. G11C 19/08
[52] U.S. Cl. ............................................. 365/10; 365/87
[58] Field of Search ....................... 365/10, 11, 12, 29, 365/36, 87

[56] References Cited

U.S. PATENT DOCUMENTS

| 3,810,131 | 5/1974 | Ashkin et al. | 365/29 |
| 3,996,576 | 12/1976 | Bullock | 365/10 |
| 4,583,200 | 4/1986 | Konishi et al. | 365/29 |
| 4,642,795 | 2/1987 | Tamada et al. | 365/10 |

FOREIGN PATENT DOCUMENTS

| 0106358 | 4/1984 | European Pat. Off. . | |
| 0096590 | 6/1984 | Japan | 365/29 |
| 0612988 | 7/1985 | Japan | 365/29 |
| 0283482 | 5/1986 | Japan | 365/29 |

OTHER PUBLICATIONS

IEEE Transactions on Magnetics—vol. MAG-8, Sep. 1972, pp. 405–407.
IBM Technical Disclosure Bulletin—vol. 16, No. 9, Feb. 1974—pp. 3114–3115.
IBM Technical Disclosure Bulletin—vol. 16, No. 6, Nov. 1973, pp. 1809–1810.
"Experimental Confirmation of Fundamental Functions for Novel Bloch Line Memory", IEEE Transactions on Magnetics, vol. MAg-19, No. 5, Sep. 1983, pp. 1841–1843, Konishi.

*Primary Examiner*—Joseph A. Popek
*Attorney, Agent, or Firm*—Fitzpatrick, Cella, Harper & Scinto

[57] ABSTRACT

There is disclosed a method of recording and/or reproducing in/from a Bloch line memory, including the step of: radiating or guiding a light beam to a vicinity of a distal end of a magnetic domain capabable of forming a Bloch line therein or on an extending line thereof.

27 Claims, 13 Drawing Sheets

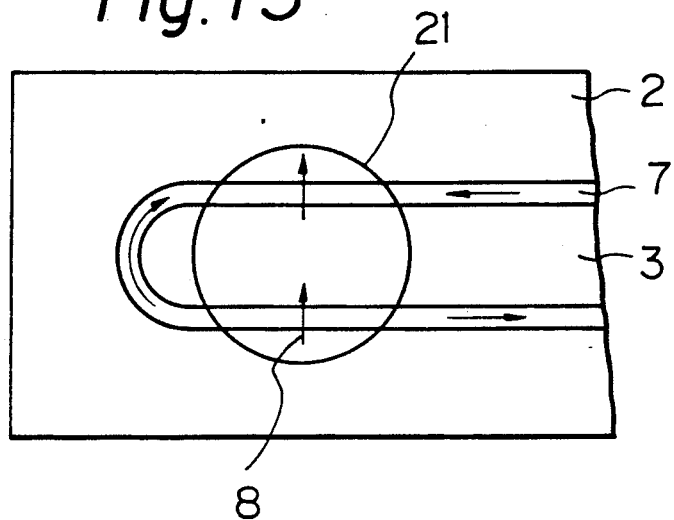
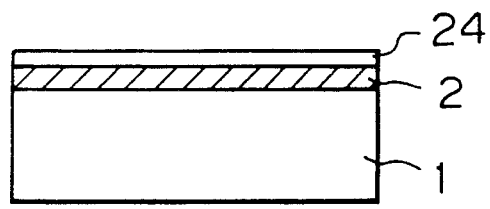
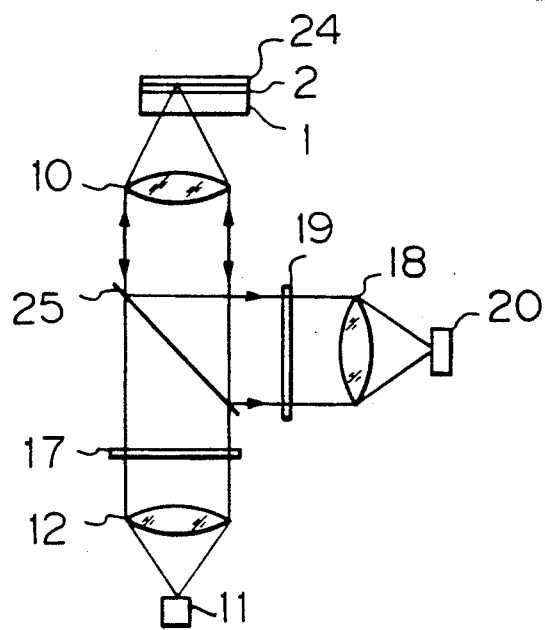

RECORDING AND/OR REPRODUCING METHOD OF BLOCH LINE MEMORY

This application is a continuation of application Ser. No. 298,333, filed Jan. 17, 1989, now abandoned, which is a continuation of application Ser. No. 800,770, filed Nov. 22, 1985, now abandoned.

BACKGROUND OF THE INVENTION

1. Field of the Invention

The present invention relates to an optical recording and reproducing method of a solid-state memory, in particular, a Bloch line memory.

2. Description of the Prior Art

Currently, various memory devices such as magnetic tape, winchester disks, floppy disks, optical disks, optomagnetic disks, or magnetic bubble memories are used as computer external memories, electronic file memories or still image file memories. Among such memory devices, memories excluding magnetic bubble memories involve relative movement between a recording medium such as a tape or disk and a recording/reproducing head. Therefore, along with a tendency toward high-density recording, many problems are encountered including the problem of tracking, the problem of travel and wear of the head, the problem of dust and vibrations, and, in the case of optical and optomagnetic disks, the problem of focusing.

Magnetic bubble memories do not require a mechanical drive section and have high reliability. In view of this, magnetic bubble memories are considered to be advantageous for high-density recording. However, in a magnetic bubble memory, a circular magnetic domain (bubble) formed in a magnetic garnet film having an axis of easy magnetization perpendicular to the film surface is used as 1 bit. Therefore, even if a minimum bubble (diameter: 0.3 $\mu$m) attainable with the material properties of the garnet film is used, the maximum recording density per chip is several tens of megabits. Thus, unless another material such as hexaferrite or amorphous alloy is used in place of garnet, higher density cannot be obtained with a magnetic bubble memory.

As a memory capable of recording at a density higher than that attainable with a magnetic bubble memory, a Bloch line memory is receiving a lot of attention. A Bloch line memory uses, as 1 bit, a transition region wherein the direction of torsion of magnetization within the domain walls, i.e., a region (a Bloch line) is formed by a Neél domain wall structure defined by Bloch domain walls, in a magnetic domain enclosed within domain walls formed in a magnetic garnet film. As compared with a magnetic bubble memory using a circular magnetic domain (bubble) as 1 bit, a Bloch line memory allows recording at a density 100 times higher than a magnetic bubble memory using a circular magnetic domain. For example, when a garnet film having a bubble diameter of 0.5 $\mu$m is used, it is possible to obtain a memory capacity of 1.6 Gbit per chip.

FIG. 1 shows a schematic structure of a conventional Bloch line memory. A substrate 1 comprises a nonmagnetic garnet, such as GGG or NbGG. A magnetic garnet film 2 is formed on the substrate 1 by LPE (Liquid Phase Epitaxy). Stripe magnetic domains 3 are formed in the film 2, and conductor line patterns 4 are formed on the film 2. A bias magnetic field HB is applied to the overall memory along the direction indicated by the arrow, i.e., downward. The data is stored in the domain walls of each stripe magnetic domain 3 in accordance with the presence or absence of a pair of Bloch lines. When the Bloch line pair is present, the data is "1", and otherwise the data is "0". The Bloch line pair is correctly present at a stable point or potential well in the stripe magnetic domain 3. When a pulse magnetic field is applied perpendicularly to the surface of the substrate, the data is sequentially transferred to the adjacent potential wells.

A conventional method of recording and reproducing data with respect to such a conventional Bloch line memory will briefly be described below.

FIG. 2 is a view for explaining a conventional method for recording in a Bloch line memory. The Bloch line memory has magnetic bubbles 5 on a major line, a conductor line 6, and stripe magnetic domains 3 as in the memory device shown in FIG. 1. Arrow A indicates the direction of current flowing to the conductor line 6. Note that a bias magnetic field (HB in FIG. 1) is applied downward from the sheet surface, and the magnetization of the stripe magnetic domains 3 and the magnetic bubbles 5 is directed in this direction. In the arrangement shown in FIG. 2, a combination of a major line as a bubble transfer path and a minor loop formed by the domain walls of the stripe magnetic domains 3 constitutes a major-minor loop as in the case of a magnetic bubble memory.

In the transfer system used in a magnetic bubble memory, e.g., in an internal rotation magnetic field system or a current drive system, the magnetic bubbles 5 are transferred onto the major line along the conductor line 6. Thus, the magnetic bubbles 5 are not arranged in front of the stripe patterns 3 for inputting a Bloch line pair but are arranged in front of the stripe patterns 3 not inputting the Bloch line pair. As a result, due to the repulsion force between a given magnetic bubble 5 and the corresponding stripe magnetic domain 3, the distance between the conductor line 6 and the stripe magnetic domain 3 is different in accordance with the presence or absence of a Bloch line pair, i.e., the presence or absence of the magnetic bubble 5. Thus, the stripe magnetic domain 3 having the magnetic bubble 5 arranged in front of it is set at a farther distance from the conductor line 6.

When a pulse current is supplied to the conductor line 6 in this state in the direction of arrow A, a local magnetic field having a direction opposite to the magnetization of the stripe magnetic domain 3 is generated near the distal end of the stripe magnetic domain 3. Then, the stripe magnetic domain 3 which is closer to the conductor line 6 contracts and a Bloch line pair is formed at the distal end of the stripe magnetic domain 3.

FIGS. 3(A) to 3(C) explain the reproducing method of the conventional Bloch line memory described above. The same reference numerals as in FIGS. 1 and 2 denote the same parts in FIGS. 3(A) to 3(C), and a detailed description thereof will be omitted. A stripe magnetic domain 3 has a Bloch line 8 at its distal end and is enclosed by domain walls 7. The arrow in the domain wall 7 indicates the direction of magnetization at the center of the domain wall, and the arrow in conductor lines 4 indicates the direction of current flowing therethrough. Referring to FIG. 3A, the stripe magnetic domain 3 is formed on a magnetic garnet film 2, and the Bloch line 8 is present in the domain wall 7. A potential well as described above is not illustrated in FIGS. 3A to 3C. Two conductor lines 4 cross the stripe magnetic domain 3. When the pulse currents of opposite directions flow as shown in FIG. 3(A), a magnetic field formed by the currents flowing in the conductor lines 4 becomes opposite to the direction of magnetization of the stripe magnetic domain 3. Therefore, the magnetic domain enclosed between the two conductor lines 4 contracts and the domain walls 7 move as indicated by dotted lines. When the currents are increased, the domain walls merge as shown in FIG. 3(B). Then, the portion of the stripe magnetic domain 3 within the merged domain walls forms a magnetic bubble 5 and is separated from the remaining portion of the stripe magnetic domain 3. After the current supply is interrupted, the Bloch line 8, similar to that formed prior to the separation of the magnetic bubble 5, is formed at the distal end of the remaining stripe magnetic domain 31, and the size of the domain is returned to the original size. FIG. 3(C) shows a case wherein the Bloch line 8 is not present. When currents are supplied to the conductor lines 4 in this state, if the Bloch line 8 is present as in FIG. 3(A), the domain walls between the two conductor lines 4 can be shifted inward and can be allowed to merge by increasing the currents. However, in FIGS. 3A and 3C wherein the Bloch line is present and not present, respectively, the directions of magnetization in the domain walls between the two conductor lines are the same in FIG. 3(A) but are opposite in FIG. 3(C). Therefore, the mutual force acting between magnetization of the domain walls upon merging become different in the two cases. That is, the current for merging the domain walls is smaller when the Bloch line 8 is present. Therefore, if the currents supplied to the conductor lines 4 are selected between the current values required for merging the domains when the Bloch line 8 is present and the current values required when the Bloch line 8 is not present, the presence or absence of the Bloch line 8 can be made to correspond to the presence or absence of the separated magnetic bubble 5. Thus, the presence or absence of the Bloch line 8 can be determined by detecting the magnetic bubble 5 by a method similar to that in the conventional magnetic bubble memory.

As described above, the conventional method of recording or reproducing a Bloch line memory utilizes bubbles in both recording and reproduction. Since this requires formation and transfer of bubbles, the overall structure becomes complex. The bit rate for recording-/reproduction remains at a value corresponding to that of a magnetic bubble memory. Thus, despite of its relatively high recording density, a conventional Bloch line memory cannot provide a sufficiently high recording-/reproducing speed (bit rate).

SUMMARY OF THE INVENTION

It is an object of the present invention to provide a method of recording and/or reproducing in/from a Bloch line memory which has a simple structure and a high bit rate.

In order to achieve the above object of the present invention, a method of recording and/or reproducing in/from a Bloch line memory there is provided, including the step of radiating or guiding light near a distal end of a magnetic domain or onto an extending line thereof, and including the step of such as an optical means such as a laser beam or the like, thereby allowing high-speed recording and/or reproduction.

BRIEF DESCRIPTION OF THE DRAWINGS

FIG. 13 is a diagram showing a modification of the reproducing method shown in FIGS. 8 and 9;

FIG. 14 shows the structure of a Bloch line memory to which the present invention can be applied and in which a reflection film is formed on a recording surface;

FIG. 15 is a diagram showing an apparatus for reproducing the Bloch line memory shown in FIG. 14;

DETAILED DESCRIPTION OF THE PREFERRED EMBODIMENTS

Figure 1:
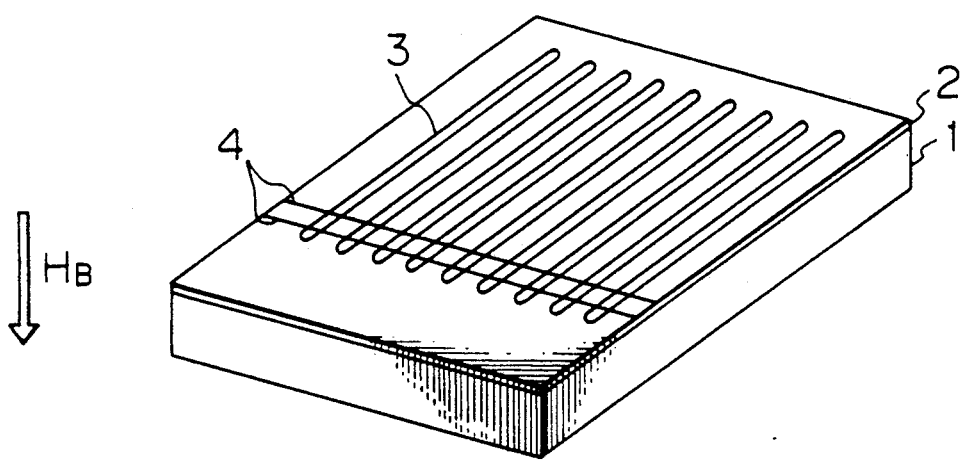
FIG. 1 is a schematic diagram showing the structure of a conventional Bloch line memory.
Figure 4:
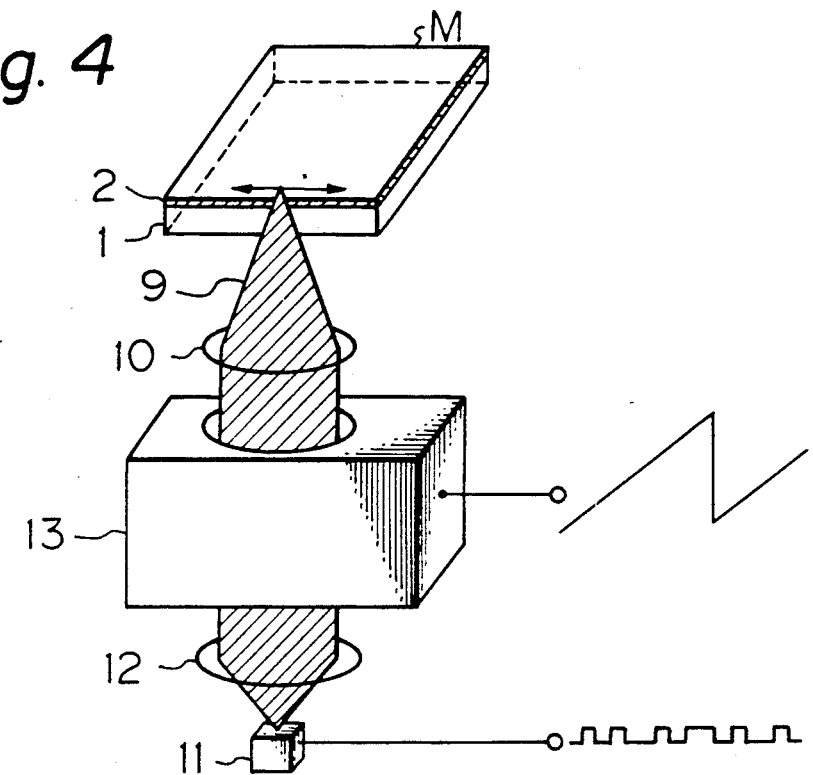
FIG. 4 is a schematic diagram showing a method of recording in a Bloch line memory according to an embodiment of the present invention.

FIG. 4 is a schematic diagram showing a method of recording in a Bloch line memory according to the present invention. The same reference numerals as in FIG. 1 denote the same parts in FIG. 4, and a detailed description thereof will be omitted. A laser beam emitted by a semiconductor laser 11 is collimated into a parallel beam by a collimator lens 12. The beam is linearly polarized by an optical polarizer 13 and formed into a scanning beam 9 by a focusing lens 10. The beam is scanned near the distal ends of a plurality of stripe magnetic domains of a magnetic garnet film 2 through a nonmagnetic garnet substrate 1. As illustrated in the figure, the optical polarizer 13 is driven by a sawtooth wave, and the semiconductor laser 11 is driven by a pulse signal.

Figure 5:
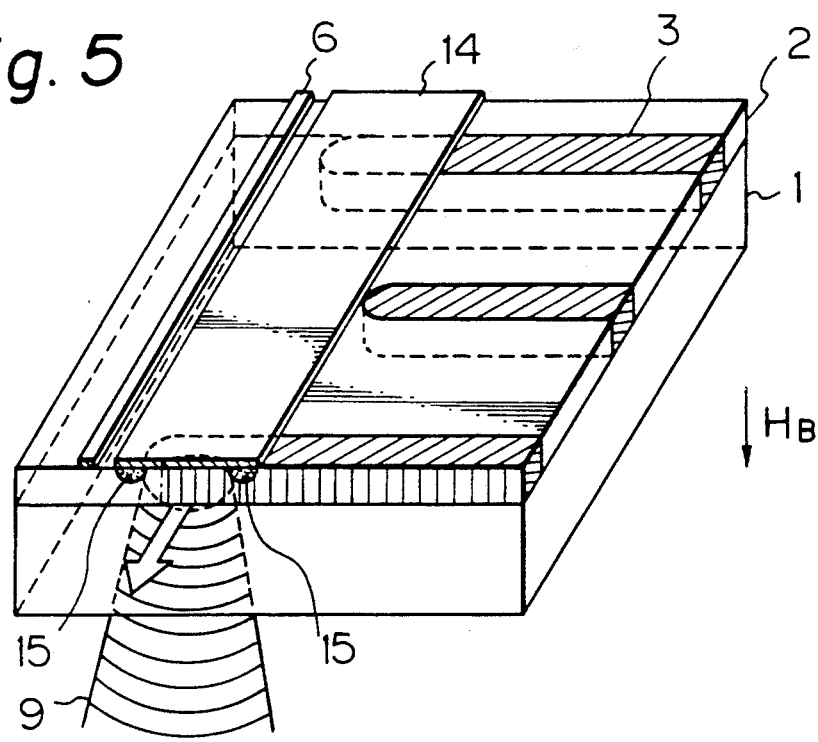
FIGS. 5 and 6(A), 6(B) and 6(C) are diagrams for explaining a method of recording in a Bloch line memory in accordance with the present invention.

FIGS. 5 and 6 are detailed diagrams for explaining a method of recording in a Bloch line memory according to the present invention. FIG. 5 illustrates the construction of the Bloch line memory and the scanning laser beam, and FIG. 6 illustrates formation of a Bloch line.

Figure 2:
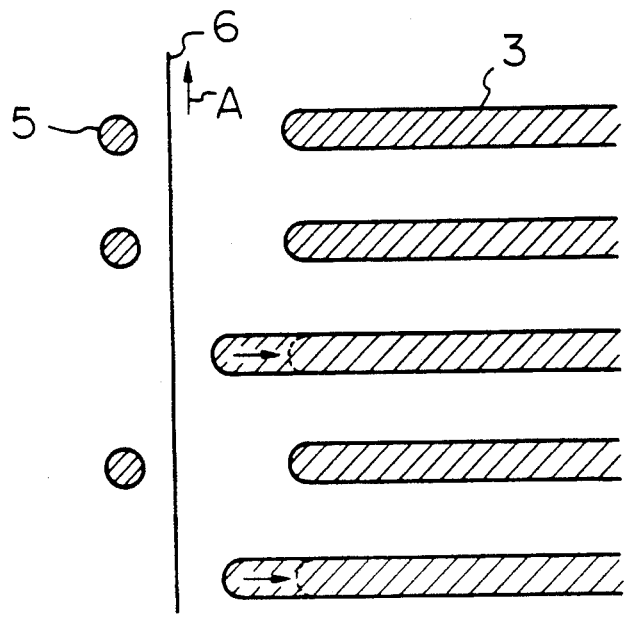
FIG. 2 is a diagram showing a conventional method of recording in a Bloch line memory.
Figure 3A:
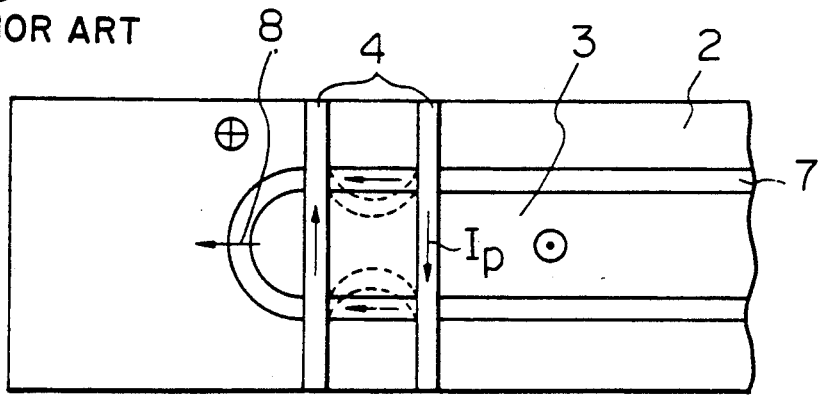
FIGS. 3(A) to 3(C) are diagrams for explaining a conventional method of reproducing from a Bloch line memory.
Figure 3B:
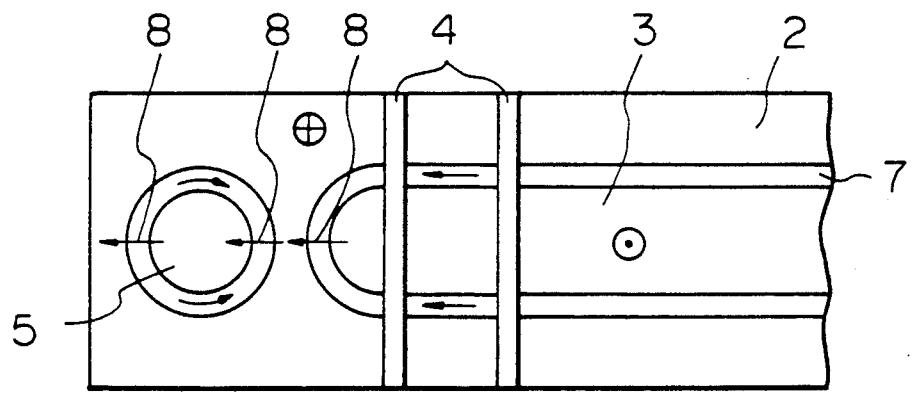
Figure 3C:
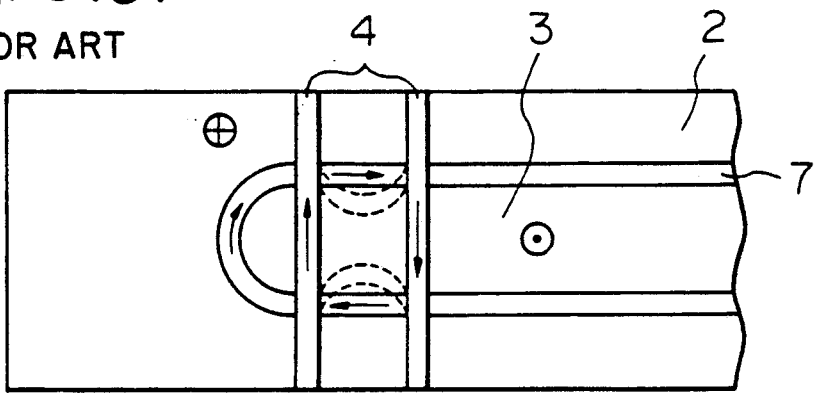

Referring to FIG. 5, a light-absorption film 14 is formed on an ion-implanted layer 15. The same reference numerals as in FIG. 2 denote the same parts in FIG. 5. A magnetic garnet film 2 is formed by LPE on a substrate 1 of monocrystalline NdGG or GGG. A vertical bias magnetic field HB is applied to the film 2 in a direction indicated by the arrow, and stripe magnetic domains 3 are formed. Conductor lines 6 of Al or Cu and a light-absorption film 14 of SB or Te are formed on the surface of the film 2 along the direction perpendicular to the longitudinal direction of the domains 3. Ion-implanted layers 15 are formed as potential wells in the film 2 below the light-absorption film 14 by ion-implantation of $H^+$ or $He^+$. The ion-implanted layers 15 are horizontal magnetization regions, and form two stable positions with respect to the distal ends of the stripe magnetic domains 3.

Figure 6A:
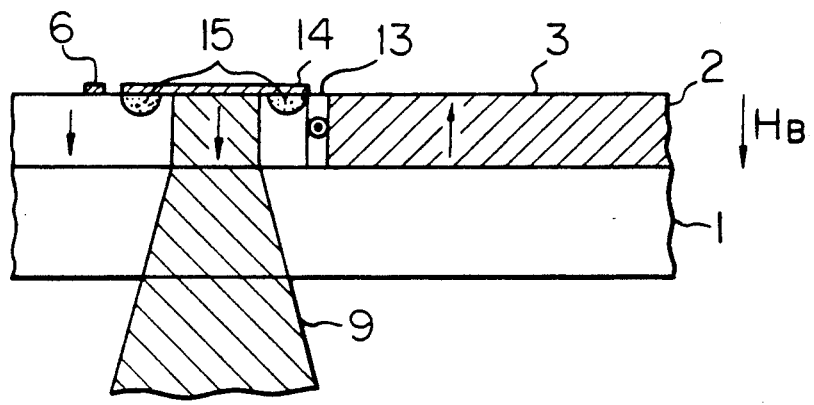
Figure 6B:
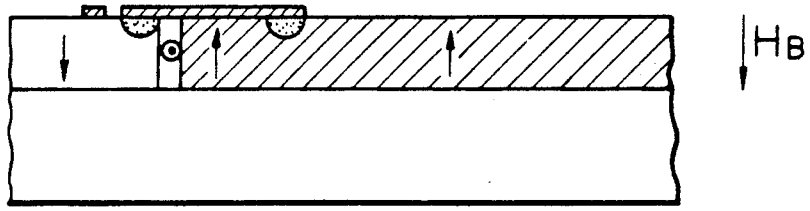
Figure 6C:
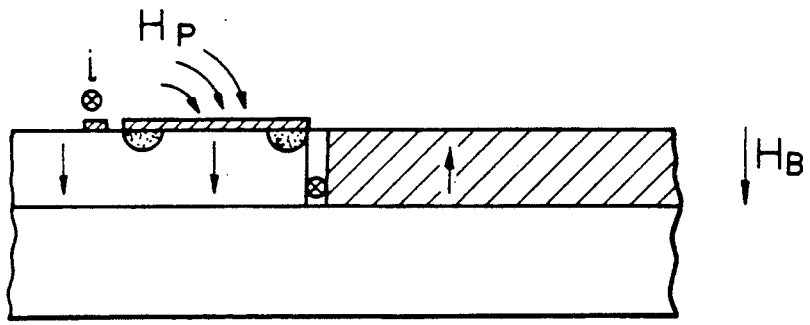

The scanning light beam 9 is scanned along the light-absorption film 14 of the Bloch line memory of the arrangement described above. The light-absorption film portions in front of the stripe magnetic domains 3 for inputting the Bloch line are scanned and the corresponding domains 3 are elongated. The Bloch line input method will be described in detail with reference to FIGS. 6(A) to 6(C). FIG. 6(A) shows a state before irradiation with the scanning light beam, FIG. 6(B) shows a state after irradiation with the scanning light beam, and FIG. 6(C) shows a state of the stripe magnetic domain 3 after supply of a pulse current. The arrow in a magnetic garnet film 2 indicates the direction of magnetization. Reference symbol Hp denotes a pulse magnetic field; and i, a current flowing in the conductor lines.

Prior to irradiation with the scanning beam 9, the distal end of the stripe magnetic domain 3 is trapped by the right side portion of the potential well formed by the two ion-implanted layers 15. The Bloch line is not present in a domain wall 7 at the distal end of the domain 3, and magnetization at the center of the domain wall 7 is perpendicular to the drawing sheet. In this state, when the scanning beam 9 is scanned from the side of the substrate and focused on the magnetic garnet film 2 and the light-absorption film 14, the temperature in the irradiated region of the magnetic garnet film 2 is increased.

The magnetic potential (domain wall potential) in the magnetic garnet film 2 has a negative temperature dependency. Therefore, in accordance with the temperature gradient formed in the magnetic garnet film 2, the stripe magnetic domain 3 is drawn to the high-temperature side and is extended in the region irradiated with the scanning beam 9. Thus, as shown in FIG. 6(B), the distal end of the stripe magnetic domain 3 is trapped in the potential well at the left of the ion-implanted layers 15. In this process, as shown in FIG. 4, when the laser beam is scanned perpendicularly to the stripe magnetic domain 3 and (turned on and off) modulated in accordance with the recording data, the stripe magnetic domain 3 for inputting the Bloch line is extended to the the vicinity of the left side ion-implanted layer is as shown in in FIG. 6(B), and the stripe magnetic domain 3 not inputting the Bloch line, remains at the original position. When the current i is flowed to the conductor line 6, after laser beam scanning, a pulse magnetic field Hp is generated and magnetization near the distal end of the stripe magnetic domain 3, which has been extended to near the conductor line 6, is inverted. Therefore, the distal end of the stripe magnetic domain 3 contracts to the original position, i.e., to the right potential well 15, and a Bloch line pair is formed.

As described above, the Bloch line pair can be shifted along the domain wall of the stripe magnetic line 3 by applying a vertical pulse magnetic field on the overall magnetic garnet film 2, thereby allowing continuous recording.

In the above embodiment, the scanning light beam is radiated from the side of the substrate. However, the scanning light beam can be radiated from the side of the magnetic garnet film 2, and various other modifications can be made. In addition, bubbles can be generated by a scanning light beam using a conventional arrangement described above, and the distance between the stripe magnetic domain and the conductor line can be controlled.

In the above embodiment, the bit rate during recording is improved using a scanning optical system. However, the scanning optical system includes a light source such as a laser, an optical polarizer utilizing an electro-optical effect, an acoustic-optical effect, or a magneto-optical effect, a mechanical optical polarizer such as a polygon mirror, and a focusing lens. This system allows scanning of light on a Bloch line memory, having a plurality of stripe magnetic domains and high-speed input of data, in the form of Bloch line pairs by optical signals corresponding to the input signals.

High-speed recording is achieved by establishing a temperature gradient near the distal ends of the stripe magnetic domains capable of forming Bloch line pairs. The apparatus in FIG. 4 is an example, and the film 2 can be irradiated with a plurality of parallel light beams, which correspond in number to the stripe magnetic domains.

As a means for establishing a temperature gradient in the magnetic film, another method can be adopted in place of the optical means as in the above embodiment. That is, for example, a heat-generating resistor is patterned at the spot position of the scanning beam and is connected to a power supply. Temperature gradient is established by utilizing Joule's heat generated by the resistor. The Bloch line pairs can be formed by contraction methods other than the contraction method using a conductor line.

Figure 7A:
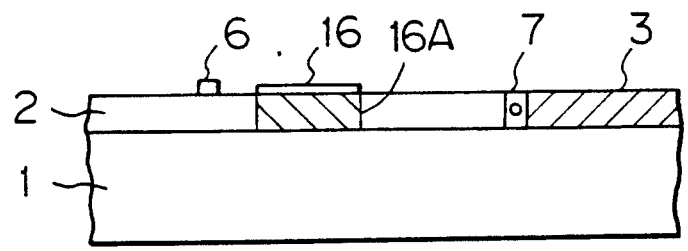
FIGS. 7(A) and 7(B) are sectional views showing the structure of a potential well.
Figure 7B:
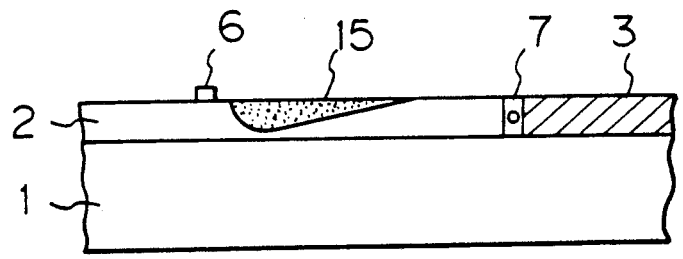

FIGS. 7(A) and 7(B) show another structure of a potential well for stabilizing a stripe magnetic domain. An ion-implanted region 15 is formed in a magnetic garnet film 2, and a permalloy pattern 16 is formed on the film 2. A stripe magnetic domain 3 is normally stabilized by a method wherein a thin line pattern of a magnetic film is formed or by a method wherein a surface of a magnetic garnet film is engraved to a shallow level along the domain 3. The domain 3 must also be stabilized after extension/contraction.

In the example illustrated in FIG. 7(A), a potential well 16A is formed by the permalloy pattern 16. The extended stripe magnetic domain 3 is trapped below the permalloy pattern 16. In FIG. 7(B), the ion-implantation energy into the magnetic garnet film 2 is varied toward the domain 3 so as to provide a moderate gradient in the potential well by a change in the state of the ion-implanted region 15. The extended or contracted position of the stripe magnetic domain 3 is stabilized by the presence of the potential well 15, and the domain 3 can also be extended thereby. Note that the potential well is not always necessary, and the stripe magnetic domain can be stabilized by another means.

Figure 8:
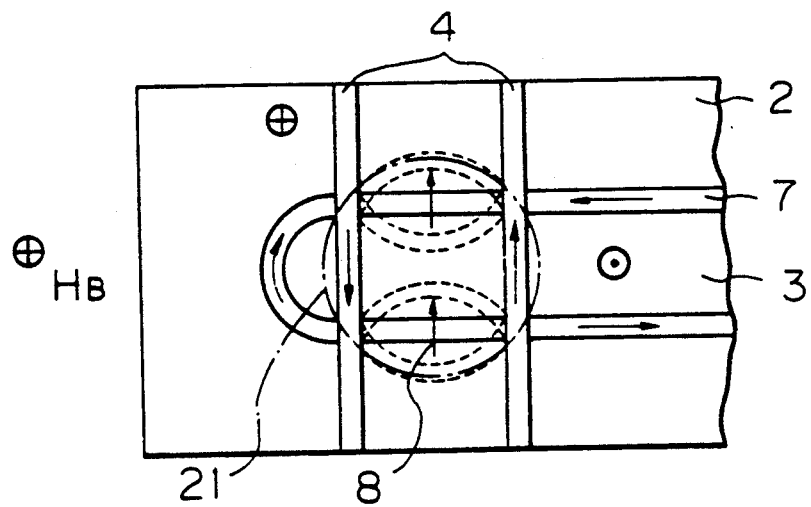
FIG. 8 is a diagram showing a method of reproducing a Bloch line memory according to the present invention.
Figure 9:
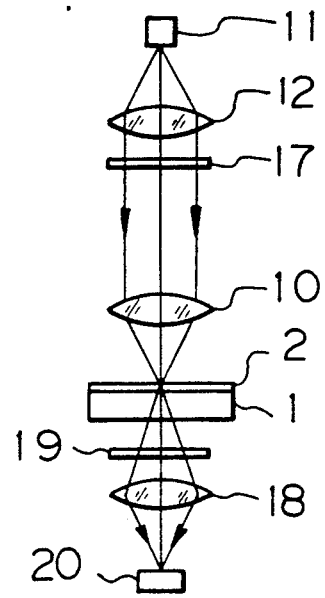
FIG. 9 is a schematic view showing the structure of an apparatus for performing the reproducing method shown in FIG. 8.
Figure 10:
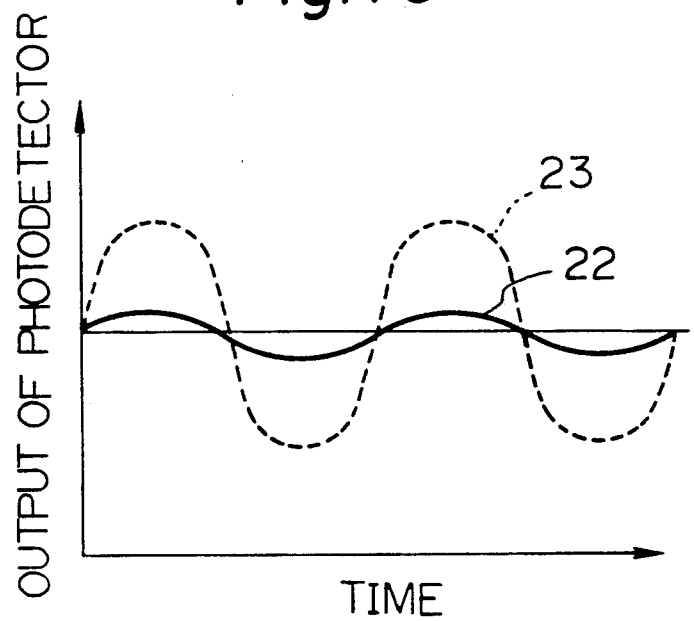
FIG. 10 is a graph showing the electrical signal output as a function of time obtained in the method shown in FIG. 8.

FIGS. 8, 9 and 10 show diagrams for explaining a method of reproducing a Bloch line memory according to the present invention. FIG. 8 shows a state of a stripe magnetic domain when a Bloch line pair is detected. FIG. 9 shows a configuration of an optical system for detecting a Bloch line pair, and FIG. 10 shows an output from a photodetector used in this method. Note that the same reference numerals as in FIGS. 1 to 4 denote the same parts in FIGS. 8, 9 and 10. A light-emitting section 11 is a semiconductor layer or a photodiode. A collimator lens 12 converts diverging light from the section 11 into a parallel beam. A focusing lens 10 focuses the beam emerging from a polarizing plate 17 to form a spot 21 at a predetermined position of a stripe magnetic domain 3. A focusing lens 18 focuses light transmitted through an analyzer 19 to a photodetector 20. The photodetector 20 produces an output 22 when a pair of Bloch lines 8 is present in the optical spot 21 and produces an output 23 when such a Bloch line pair is not present in the spot 21.

Referring to FIG. 8, a vertical bias magnetic field HB is applied downward (along a direction perpendicular to the drawing sheet) to a magnetic garnet film 2, such as $(YSmLuCa)_3(FeGe)_5O_{12}$ or $(YSmLuCd)_3(FeGa)_5O_{12}$, so as to form a stripe magnetic domain 3. Bloch lines 8 are present in domain walls 7 surrounding the stripe magnetic domain 3. Two conductor lines 4 are formed on the film 2, so as to sandwich at least one Bloch line 8. The Bloch lines 8 are stably held between the conductor lines 4 by the potential wells. When currents are flowed in the conductor lines 4 in the directions indicated by the arrows, if the directions of the magnetic field induced by the currents are the same as the direction of magnetization of the stripe magnetic domain 3, the domain walls sandwiched between the two conductor lines 4 are shifted outward. However, when the directions of the currents are opposite to those indicated in FIG. 8, the domain walls between the conductor lines 4 are shifted inward.

Referring to FIG. 9, diverging light emitted by the light-emitting section 11 is converted into a parallel light beam by the collimator lens 12 and is linearly polarized by the polarization plate 17. Then, a spot 21 as shown in FIG. 8 is formed through the focusing lens 10 at a predetermined magnetic domain position. The light beam transmitted through the magnetic garnet film 2 and the substrate 1 has undergone rotation of the plane of polarization by the Faraday effect due to the magnetization of the stripe magnetic domain 3. The rotational angle of the plane to polarization is proportional of the magnitude of the magnetization of the stripe magnetic domain 3. The transmitted light beam is passed through the analyzer 19 and becomes incident on the photodetector 20 through the focusing lens 18. An output signal from the photodetector 20 depends on the magnitude of the magnetization or the magnetized area of the stripe magnetic domain 3. Therefore, if the currents supplied to the conductor lines 4 are changed sinusoidally, an output from the photodetector 20 also changes sinusoidally. If a Bloch line 8 is present between the two conductor lines 4, when the domain walls 7 oscillate, the domain wall interval becomes narrower than that in the case wherein no Bloch line is present between the two conductor lines 4. Therefore, the damping force acting against movement of the domain wall is larger in the former case. Thus, since the magnetic inertia is large, changes in area of the stripe magnetic domain 3 are small. As compared to the case wherein no Bloch line is present between the conductor lines 4, the oscillation of the output from the photodetector 20 becomes small. As shown in FIG. 10, different outputs are obtained when the Bloch line is present and is not present between the conductor lines. In this manner, the presence or absence of the Bloch line can be determined.

Since the Bloch line pair can be directly detected using the above method, high-speed detection can be performed. Since there is no need to chop the stripe magnetic domain, the currents to be supplied to the conductor lines can be reduced.

Figure 11:
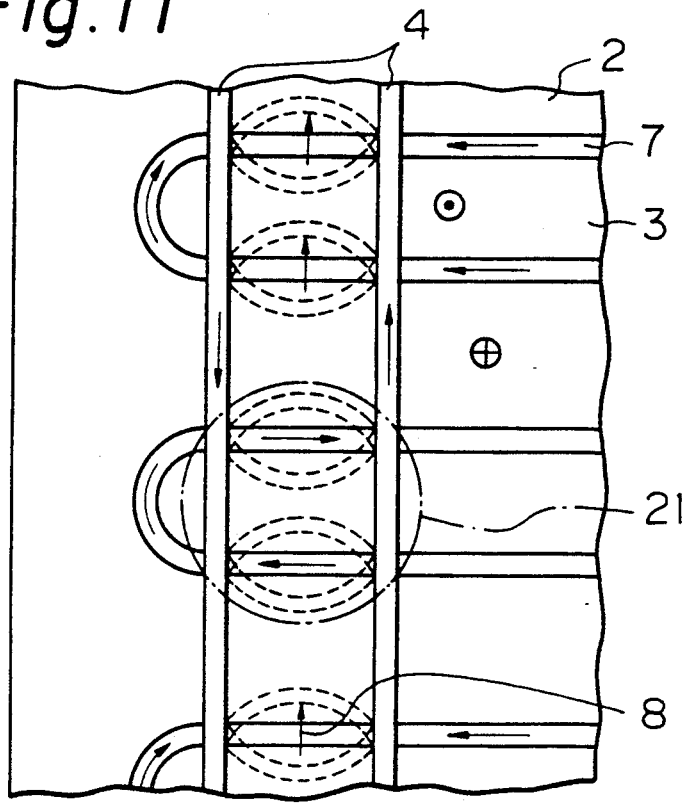
FIGS. 11 and 12 are diagrams for explaining an application of the reproducing method shown in FIGS. 8 and 9.
Figure 12:
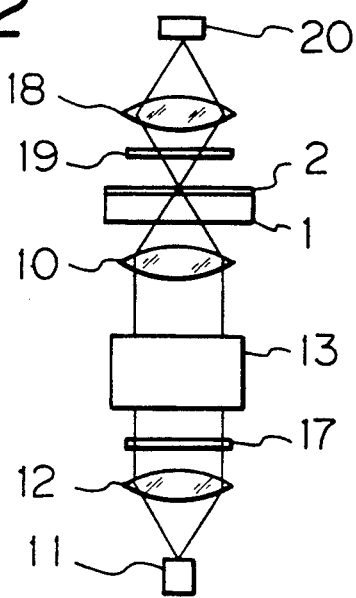

FIGS. 11 and 12 show applications of the embodiment described above. FIG. 11 shows an example of the structure of a Bloch line memory having a plurality of stripe magnetic domains. FIG. 12 shows an example of the structure of an optical detection system for the Bloch line memory shown in FIG. 11. The same reference numerals denote the same parts in FIGS. 11 and 12. An optical polarizer 13 can be an A/O polarizer or an E/O polarizer.

Predetermined positions of a plurality of stripe magnetic domains 3 are continuously irradiated with scanning light from the side of a substrate 1 using the optical detection system as shown in FIG. 12. High-speed reproduction from the Bloch line memory is enabled in accordance with the detection principle as in the embodiment described above. Bloch lines in domain walls 7 can be sequentially transferred by applying a vertical pulse magnetic field to the overall memory. The optical system can comprise a plurality of pairs of light-emitting elements and light-receiving elements.

FIG. 13 shows another means for changing a predetermined magnetic domain area. The same reference numerals as in the above embodiments denote the same parts in FIG. 13. The magnetic domain area is changed by the opto-thermal effect. When a magnetic garnet film 2 is irradiated with a linearly polarized light beam by the same method as in the above embodiment, the temperature of the irradiated portion or of a spot 21 increases. The width of a stripe magnetic domain 3 at the irradiated portion changes depending upon the temperature charactersitics of the material of the film 2. When the light intensity of a light-emitting section, such as a semiconductor laser, is changed over time, the area of the stripe magnetic domain can be changed over time. With this method, conductor lines are not necessary. Therefore, the structure of the memory is simplified and power consumption is reduced.

FIG. 14 is a sectional view showing another structure of a Bloch line memory. A light-reflection film 24 is formed on a magnetic garnet film 2 by deposition or the like. The Bloch line memory having this arrangement can detect a Bloch line pair by the method in the above embodiment using an optical system shown in FIG. 15.

Referring to FIG. 15, except for a beam splitter 25, the same reference numerals as in the above embodiment denote the same parts. A light beam from a light-emitting section 11 is converted into a parallel light beam by a collimator lens 12. The light beam is then linearly polarized by a polarization plate 17. The light beam from the polarization plate 17 is passed through the beam splitter 25 and irradiated onto a predetermined position of a stripe magnetic domain 3 formed in a magnetic garnet film 2. The incident light beam, which has been modulated in accordance with the presence or absence of a Bloch line pair, is reflected and modulated by the light-reflection film 24 to return to the original path. Thus, the light beam is subjected to two Faraday rotations. The reflected light beam, which has been converted into a parallel beam through a focusing lens 10, is changed in its optical path by a beam splitter 25. The light beam is thus passed through a photosensor 19 and a focusing lens 18 and becomes incident on a photodetector 20. With the above-mentioned arrangement, the S/N ratio is improved by two Faraday rotations.

Figure 16A:
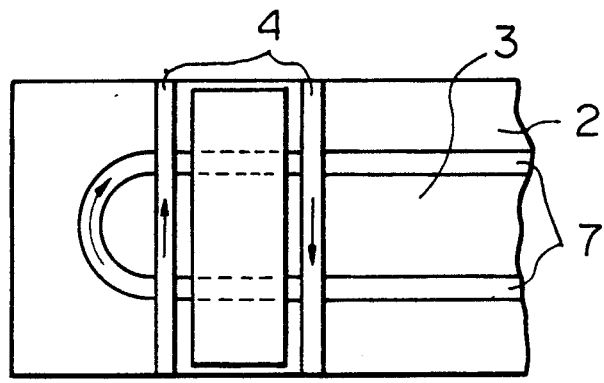
FIGS. 16(A) to 16(C) are diagrams showing other means for detecting changes in magnetic field in accordance with changes in area of a magnetic domain.
Figure 16B:
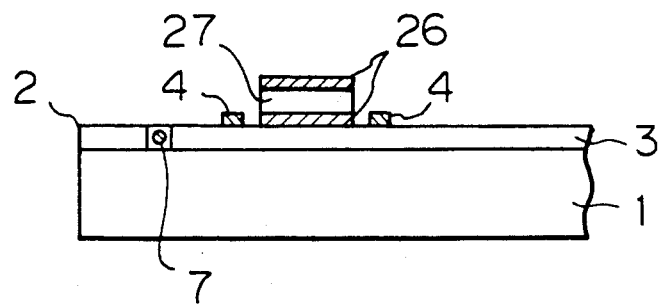
Figure 16C:
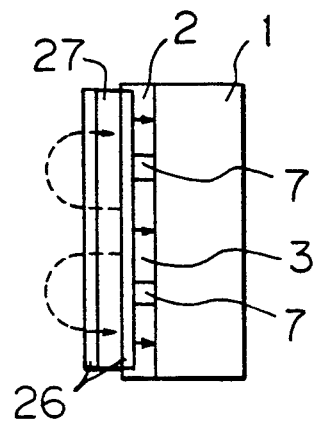

FIGS. 16(A) to 16(C) show another embodiment of a reproduction method of a Bloch line memory. More specifically, FIG. 16(A) shows a top view of a Bloch line memory, FIG. 16(B) shows a sectional view thereof, and FIG. 16(C) shows a side view thereof. Electrodes 26 are for detecting a capacitance. A magnetostrictive material 27 is arranged at a predetermined position on a magnetic garnet film 2. The same reference numerals as in the above embodiment denote the same parts in this embodiment.

Due to a magnetic field produced upon supplying currents to conductor lines 4, the domain walls 7 between the conductor lines 4, oscillate at different magnitudes in accordance with changes in currents supplied to the lines 4. The area of a stripe magnetic domain 3, sandwiched between the conductor lines 4, changes and the distribution of the magnetic field changes as indicated by the broken arrows in FIG. 16(C). Then, the distribution of a magnetic field applied to the magnetostrictive material 27 between the electrodes 26 changes, and the capacitance changes in accordance with changes in effective interval between the electrodes 26. The presence or absence of a Bloch line pair can be determined by detecting such changes in capacitance. With the above method, since there is no need to detect a Bloch line pair by forming a bubble, high-speed detection can be performed and an optical system as used in the above embodiment is not necessary. An optical system having a simple structure can be used.

According to the embodiment described above, since a difference in area (changes in magnetic field) of a predetermined magnetic domain region, depending on the presence or absence of a Bloch line pair, is detected, magnetic bubbles, as in conventional memories, need not be used and high-speed reproduction can be performed. In addition, when a linearly polarized light beam obtained by linearly polarizing a laser beam is radiated and a difference in rotational angle of the plane of polarization is detected, the memory structure can be simplified. The reproduction bit rate can be significantly improved by scanning a laser beam on a plurality of the stripe magnetic domains by a predetermined means.

The optical detection system used in the above embodiment is only an example, and an optical detection, means of an arrangement suitable for a particular memory device used, must be selected.

Figure 17:
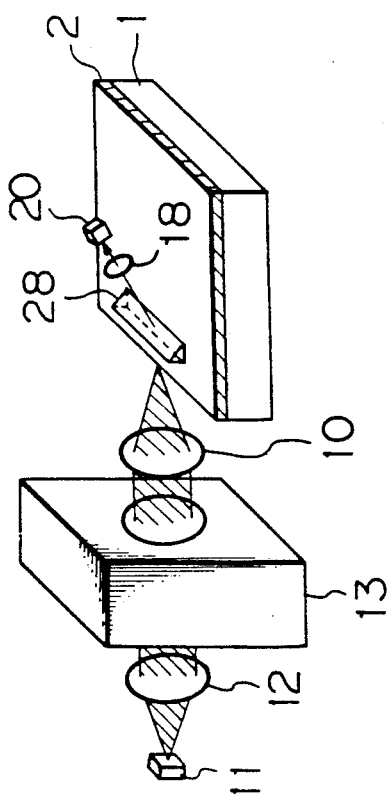
FIG. 17 is a schematic diagarm showing the structure of an apparatus for performing another method of reproducing a Bloch line memory according to the present invention.

FIG. 17 is a diagram showing the schematic construction of an apparatus for performing another reproducing method of a Bloch line memory. As in the above embodiment, the apparatus has a semiconductor laser 11, focusing lenses 10, 12 and 18, an optical polarizer 13, and a photodetector 20. The apparatus further has a rutile prism 28. A laser beam emitted by the semiconductor layer 11 is converted into a parallel light beam by the focusing lens 12 and is polarized by the polarizer 13. The light beam emerging from the polarizer 13 is incident on and scans the distal ends of a plurality of stripe magnetic domains formed in a magnetic garnet film 2 through the focusing lens 10. Channel waveguides are formed in the film 2, along the respective stripe magnetic domains. The incident light beam propagates through the waveguides and reads out the data stored in each stripe magnetic domain in the form of a Bloch line pair in accordance with a physical change of incident light beam, i.e., rotation of the plane of polarization. Thereafter, the light beam emerges outside the film 2 through the rutile prism 28 and is received by the photodetector 20. The method of detecting a Bloch line pair will be described in detail with reference to the accompanying drawings.

Figure 18:
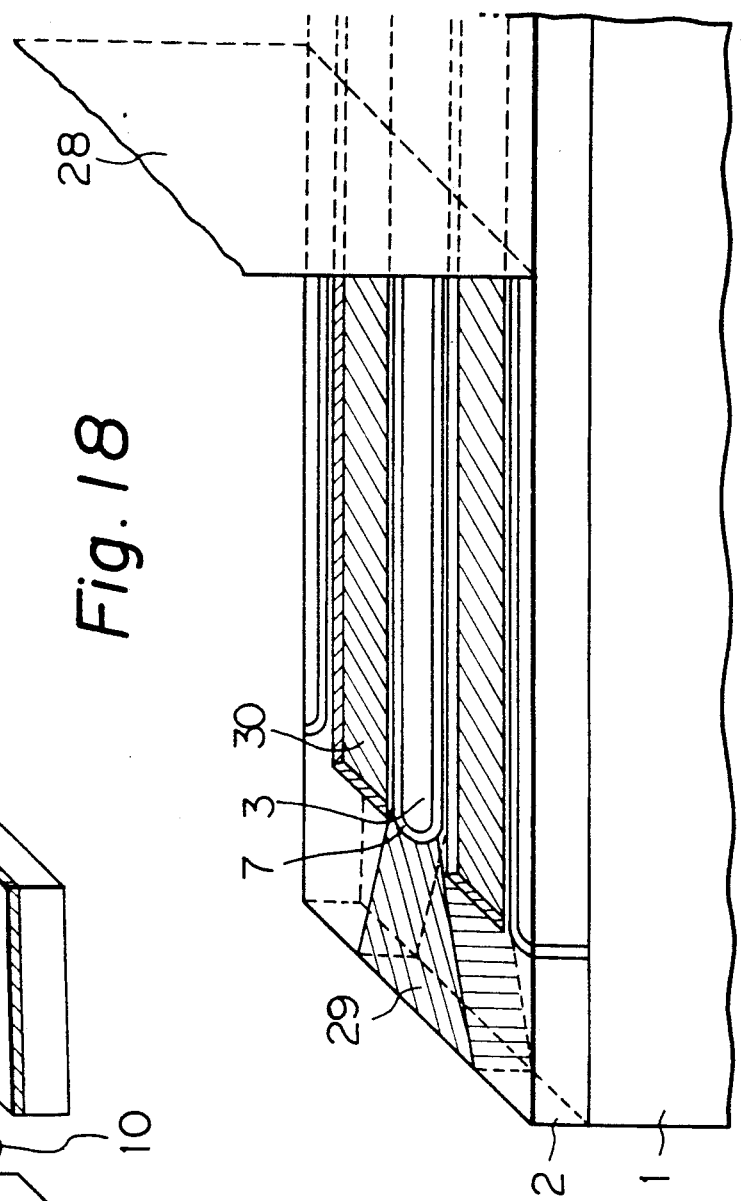
FIGS. 18 and 19 are diagrams of a reproducing method in the apparatus shown in FIG. 17.
Figure 19:
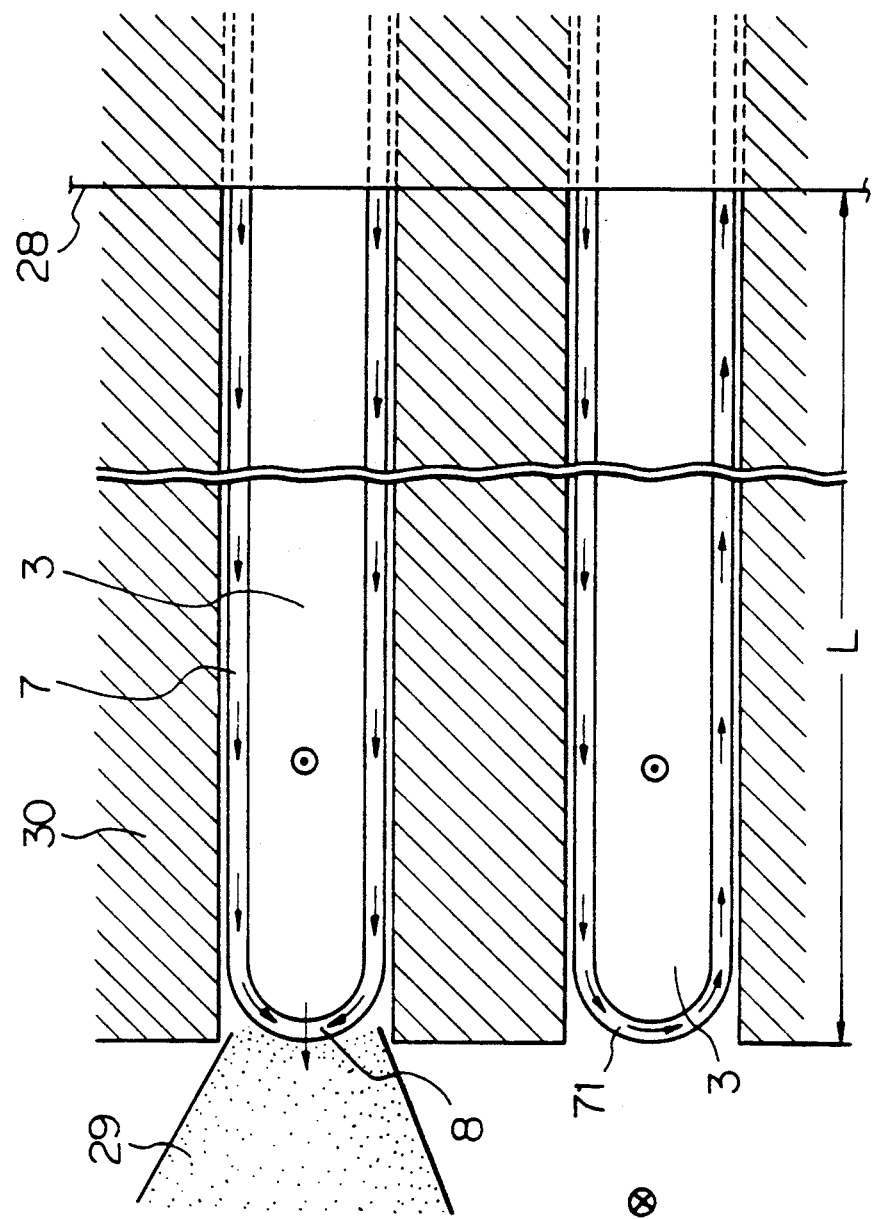

FIG. 18 is a perspective view of a magnetic garnet film having a stripe magnetic domain. FIG. 19 is a plan view thereof. The same reference numerals as in the above embodiment denote the same parts in this embodiment, except for an incident light beam 29 and a groove 30. As shown in FIG. 18, the groove 30 is formed by ion milling around each stripe magnetic domain 3. Stripe magnetic domains 3 is formed in channel waveguides surrounded by the grooves 30. Therefore, when a magnetic garnet film, in which a 2-$\mu$m width stripe magnetic domains 3 is formed, is used, the width of the channel waveguides is also about 2 $\mu$m. Note that the width of the waveguides is never smaller than that of the stripe magnetic domains 3 and 3. Referring to FIG. 19, the stripe magnetic domain 3 defined by the channel waveguide has a Bloch line at its distal end, and the stripe magnetic domain 3 does not have a Bloch line. Arrows in FIG. 19 denote the direction of central magnetization. Domain walls 7 of the magnetic domain 3 having a Bloch line 8 have magnetization in the same direction, and domain walls 7 of the magnetic domain 3, not having a Bloch line, have magnetization of opposite directions. Since the propagation direction of the laser beam 29, propagating in the channel waveguide, is perpendicular to the direction of magnetization, the laser beam 29 does not undergo rotation of the plane of polarization. However, the laser beam 29 is subject to the Faraday effect by the domain walls 7 and 71 and the plane of polarization is rotated. When the laser beam 29 of TE mode propagates in the waveguide, in the case of the magnetic domain 3, since the phase shifts of Faraday rotation, due to the magnetization, in the opposing domain walls are the same, the plane of polarization is rotated and a TM component is produced. However, in the case of the magnetic domain 3, since the direction of Faraday rotation changes in opposite phases in the opposing domain walls, the plane of polarization is not rotated and a TM component is not produced. Therefore, distance L in the waveguide is set such that the plane of polarization of the incident light beam 29 undergoes Faraday rotation through a predetermined angle under the condition that no other Bloch line is present in the interval from the distal end of the magnetic domain 3 or 3 to the position of the rutile prism 28, i.e., the above-mentioned waveguide. For example, when it is desired to obtain a rotation of 90°, L=45 $\mu$m for a magnetic garnet film having a Faraday rotational angle of 2,000°/cm.

Figure 20:
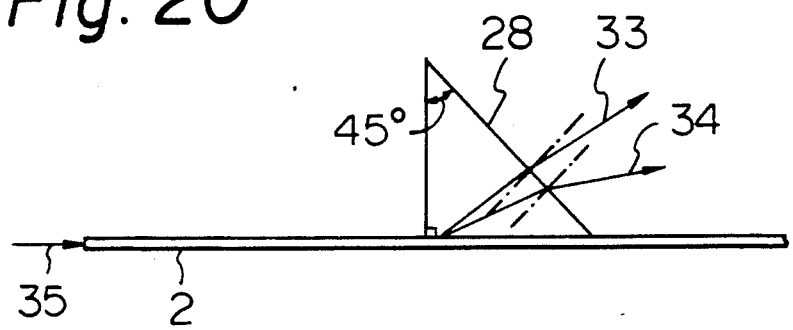
FIGS. 20 and 21 are diagrams showing examples of an apparatus for sampling and detecting laser beam light from a magnetic garnet film.

FIG. 20 shows the detection principle of a light beam 29 emerging out from the film 2. The light beam 29 includes a TE wave 33 and a TM wave 34. After the light beam propagates through the magnetic domain 3 or 3 and is modulated in accordance with the presence or absence of the Bloch line 8, as described above, it emerges outside the film 2 through the rutile prism 28. The TE wave 33 and the TM wave 34 are completely separated by the birefringence ($\eta$TE=2.903, $\eta$TM=2.616) of the rutile prism 28. Therefore, when only the TM wave 34 is received by the photodetector, data on the presence or absence of the Bloch line can be obtained. In the above arrangement, about 10% of an output light for the stripe magnetic domain, having a Bloch line, is converted into the TM wave. When a TE wave is radiated onto a channel waveguide having 250 stripe magnetic domains of a width of 2 $\mu$m by a laser beam at a scanning frequency of 100 kHz, if the time required for transferring Bloch line 1 bit upon application of a vertical bias bit on the overall memory is assumed to be 1 $\mu$sec, the reproduction bit rate is about 23 Mbit/sec. This reproduction bit rate is very large compared with 1 Mbit/sec obtained in the conventional method.

Figure 21:
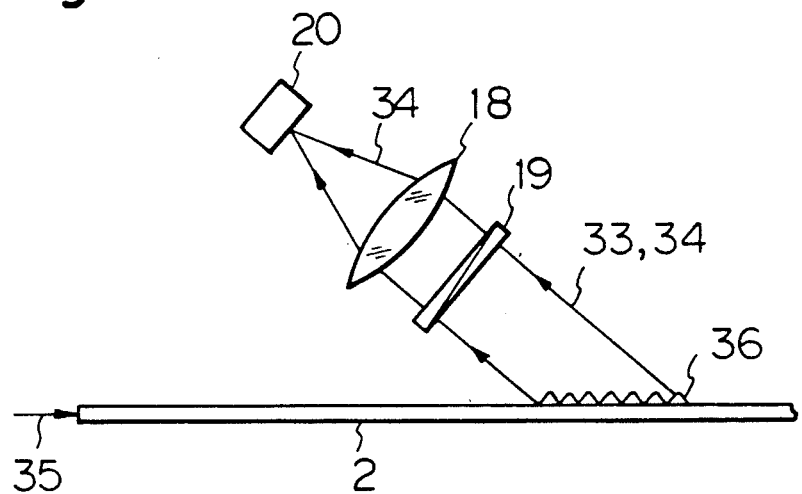

FIG. 21 shows another arrangement of an optical detection system including a grating coupler 36 and an analyzer 19. In this arrangement, the grating coupler 36 is used to output the waveguide light beam from a magnetic garnet film 2. Output light including a TE wave 33 and a TM wave 34 is focused onto a detection surface of a photodetector 20 by a focusing lens 18 through the analyzer 19 having the same polarization direction as the TM wave. Therefore, the photodetector 20 receives only the TM wave, and the presence or absence of the Bloch line can be read in accordance with the above-mentioned principle.

Figure 22:
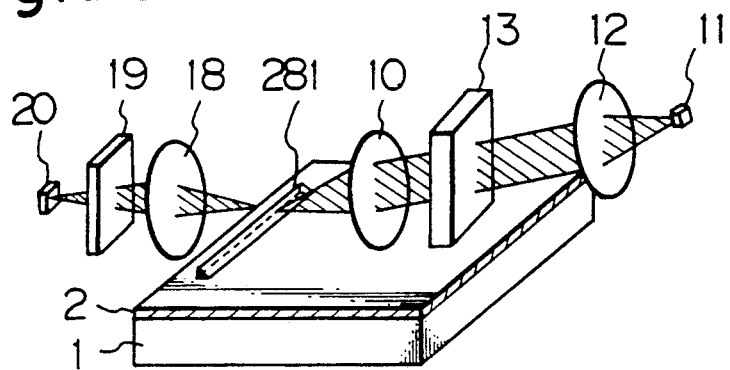
FIGS. 22 and 23 are diagrams showing modifications of the reproduction apparatus shown in FIG. 17.

FIG. 22 shows another arrangement for performing a reproducing method of a Bloch line memory according to the present invention. The arrangement has a prism coupler for guiding a light beam to each stripe magnetic domain defined by a waveguide. A laser beam emitted by a semiconductor laser 11 becomes incident on an optical polarizer 13 through a focusing lens 12. The laser beam is polarized by the polarizer 13 and is scanned on the prism polarizer 281 at a predetermined location through a focusing lens 10. The prism coupler 281 guides the laser beam to a waveguide corresponding to each stripe magnetic domain. The light beam reads (is modulated by), by rotation of the plane of polarization, data stored in the domain wall of the stripe magnetic domain. The light beam is then output from the end face of the magnetic garnet film 2 and is received by a photodetector 20 through the focusing lens 18 and the analyzer 19.

Figure 23:
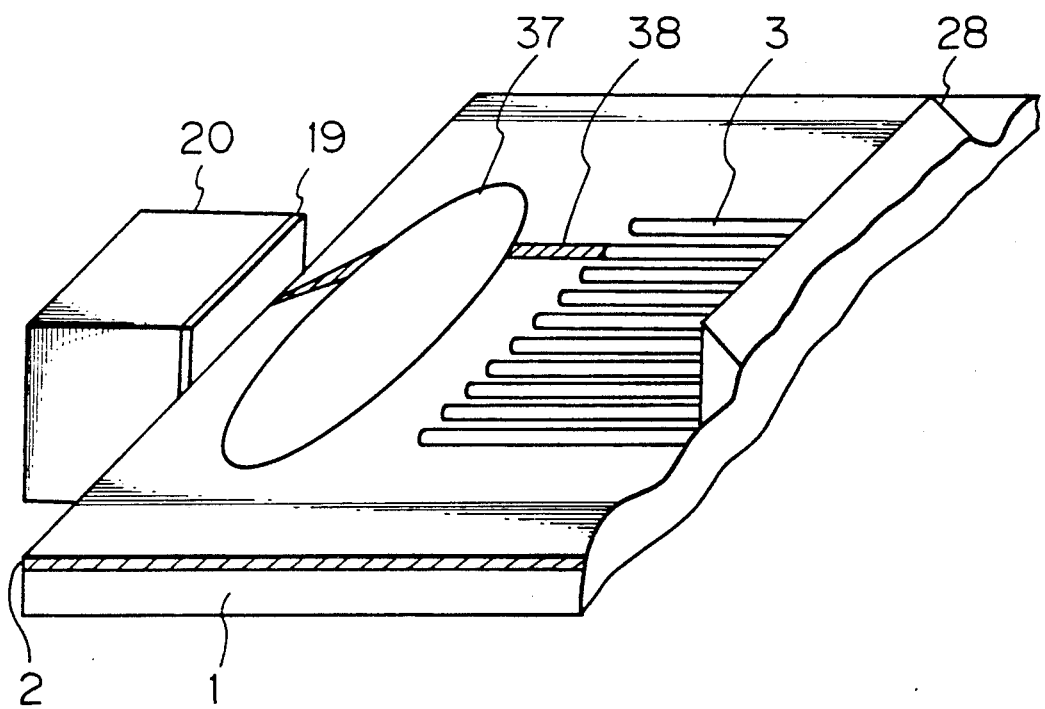

FIG. 23 shows an arrangement of the optical detection system. In this arrangement, the method for guiding a laser beam to each stripe magnetic domain is the same as in the embodiment shown in FIG. 22. A light beam 38 is output from a stripe magnetic domain 3 or 3. A thin film lens 37 can be a diodisk lens or the like. The light beam 38 which has read the data from the stripe magnetic domain 31 or 32 is focused by the thin film lens 37 formed in a magnetic garnet film 2 onto a photodetector 20 in contact with a Bloch line memory. The analyzer 19 is inserted between the photodetector 20 and the Bloch line memory. The light beam 38 received by the photodetector 20 is selected by the analyzer 19. With this embodiment, a Bloch line can be detected with a compact arrangement.

With reference to FIG. 23, the memory and the detector are formed integrally with each other. However, the memory and a light source, such as a semiconductor laser, can be formed integrally with each other. In order to modulate a waveguide light beam by magnetization in domain walls, a predetermined waveguide distance must be guaranteed. Therefore, the position of a potential wall must be at a predetermined distance from the distal end of a stripe magnetic domain to trap (stabilize) the Bloch line in a domain wall.

In this embodiment, a Bloch line detection light beam consisting of a linearly polarized light beam, such as a laser beam, is radiated onto the distal end of a stripe magnetic domain constituting a memory. The change in state of the light beam corresponding to the magnetization in the domain wall at the distal end is detected so as to determine the presence or absence of a Bloch line. As described above, when a Bloch line is not present, the directions of magnetizations in the opposing domain walls, sandwiching the magnetic domain through which the light beam is propagating, are opposite to each other. Therefore, rotations of the plane of polarization of the light beam cancel each other and the output light beam has the same polarization direction as the input light. When one Bloch line is present at the distal end of the stripe magnetic domain, the directions of magnetization in the domain walls, sandwiching the magnetic domain, are parallel to each other and are toward the same side. Therefore, the light beam is output after undergoing rotation of the plane of polarization by the Faraday effect. The presence or absence of a Bloch line can be determined by separating and detecting two output light components by a predetermined method. The predetermined method, in this case, is, e.g., a method of inserting a substance having a birefringence or a polarization plate as described in the above embodiments.

As described above, in the recording and/or reproducing method of a Bloch line memory, according to the present invention, an optical means is used for forming and detecting a Bloch line. Thus, the memory structure is simplified and high-speed recording and reproduction can be performed in a non-contact manner. As can be seen from the above embodiments, a laser beam is particularly effective. Thus, a totally new method of forming and detecting a Bloch line is provided utilizing by a compactness properties, high energy characteristics, and the polarization and magnetic properties of a laser beam. In addition, for a large-capacity memory having a plurality of stripe magnetic domains, light-beam scanning is performed to improve the bit rate.

We claim:

1. A method of producing a Bloch line in a magnetic wall of a stripe magnetic domain formed in a magnetic thin film, comprising the steps of:
   establishing a temperature gradient in a portion of the magnetic thin film in the vicinity of an end of the stripe magnetic domain, thereby extending the end of the magnetic domain according to said temperature gradient; and
   contracting said extended end, thereby producing the Bloch line in the magnetic wall of said end.

2. A method according to claim 1, wherein said establishing step includes a step for extending said magnetic domain to a potential well previously formed in said magnetic thin film so as to position the end portion of said magnetic domain at said potential well.

3. A method according to claim 2, wherein said potential well has a gradient equal to said potential.

4. A method according to claim 1, wherein said establishing step includes a step of irradiating said portion of the magnetic thin film with a laser light beam.

5. A method according to claim 4, further comprising a step of moving said Bloch line produced in said contracting step along said magnetic wall.

6. A method according to claim 4, wherein a plurality of said stripe magnetic domains are formed in said magnetic thin film, and portions of the magnetic thin film in the vicinity of the ends of said plural stripe magnetic domains are consecutively irradiated with the laser light beam by scanning of the laser light beam.

7. A method of producing a Bloch line in a magnetic wall of a stripe magnetic domain formed in a magnetic thin film, comprising the steps of:
   extending an end of the stripe magnetic domain to a predetermined position, wherein said extending step includes a step of establishing a temperature gradient in a portion of the magnetic thin film in the vicinity of said end; and
   contracting said extended end from said predetermined position, thereby producing the Bloch line in said end of the magnetic domain.

8. A method according to claim 7, wherein said establishing step includes a step of irradiating said magnetic thin film with a laser light beam.

9. A method according to claim 8, further comprising a step of irradiating said region to be detected with a laser light beam, and wherein the manner of the change in the area of the magnetic domain is detected by detecting a polarized state of the laser light beam from said region to be detected.

10. A method according to claim 8, said discriminating step comprising a step of detecting a change of distribution of a magnetic field in said region to be detected to detect the manner of the change in the area of the magnetic domain.

11. A method according to claim 8, wherein said changing step is conducted by applying a pulse magnetic field vertical to a plane defined by said magnetic thin film, to said region to be detected.

12. A method according to claim 8, wherein said changing step is conducted by irradiating said region to be detected with a laser light beam.

13. A method of optically reproducing information in a Bloch line memory in which the information is recorded in a form of a Bloch line, said Bloch line having been formed in a magnetic wall of a stripe magnetic domain formed in a magnetic thin film, said method comprising the steps of:
   irradiating a portion of a magnetic thin film in the vicinity of an end of a stripe magnetic domain with a light beam; and
   opto-electrically converting the light beam from said magnetic thin film to obtain a signal corresponding to a presence and/or absence of the Bloch line in a magnetic wall in the magnetic domain of said end, thereby reproducing the information based on said signal.

14. A method according to claim 13, wherein said irradiating step includes a step of supplying a laser light beam, and a step of irradiating a predetermined region including a pair of opposed magnetic walls of the stripe magnetic domain, with the laser light beam.

15. A method according to claim 14, further comprising a step of oscillating said pair of the opposed magnetic walls to change an area of the magnetic domain in said predetermined region.

16. A method according to claim 15, wherein said laser light beam is a predetermined linearly polarized light having a polarization plane rotated by passing said predetermined region, and said converting step includes a step of receiving the laser light beam whose polarization plane is rotated, through an analyzer.

17. A method according to claim 16, wherein said oscillating step is conducted by applying a pulse magnetic field vertical to a plane defined by the magnetic thin film, to said predetermined region.

18. A method according to claim 14, wherein said irradiating step includes a step for directing a first portion to one of said magnetic walls opposite to each other so as to propagate therein and directing a second portion into the other of said magnetic walls so as to propagate therein, wherein said first portion and said second portion are included in the laser light beam.

19. A method according to claim 18, wherein said first and second portions are each a predetermined linearly polarized light whose polarization plane is to be rotated by propagating along said pair of the opposed magnetic walls, and said converting step includes a step of causing said first and second portions whose polarization planes are rotated to emerge from said magnetic thin film and further comprising a step of receiving said first and second portions by a photodetector, through an analyzer.

20. A method according to claim 19, wherein said laser light beam is directed to said magnetic thin film through an end surface of a substrate which constitutes said Bloch line memory.

21. A method according to claim 20, wherein said laser light beam is caused to emerge from said magnetic thin film through a coupling member formed on said magnetic thin film.

22. A method according to claim 14, wherein the magnetic thin film has formed therein a plurality of the stripe magnetic domains, and wherein said irradiating step comprises the step of consecutively irradiating predetermined regions of the respective stripe magnetic domains with the laser light beam by scanning of the laser light beam.

23. A method of optically inputting information in a Bloch line memory in which the information is recorded in a form of a Bloch line, said Bloch line being formed in a magnetic wall of a stripe magnetic domain formed in a magnetic thin film, said method comprising the steps of:
   irradiating a magnetic thin film with a light beam so as to extend an end of the magnetic domain; and
   contracting said extended end, thereby producing the Bloch line in the magnetic wall.

24. An apparatus for optically inputting information in a Bloch line memory in which the information is recorded in a form of a Bloch line, said Bloch line being formed in a magnetic wall of a stripe magnetic domain in a magnetic thin film, said apparatus comprising:
   means for irradiating a portion of a magnetic thin film so as to extend an end of the magnetic domain; and
   means for applying a pulse magnetic field to the extended end, in a direction perpendicular to the surface of the magnetic thin film, so as to produce the Bloch line by contraction of the extended end.

25. An apparatus for optically reproducing information in a Bloch line memory in which the information is recorded in a form of a Bloch line, said Bloch line having been formed in a magnetic wall of a stripe magnetic domain formed in a magnetic thin film, said apparatus comprising:
   irradiating means for irradiating a magnetic thin film with a light beam; and opto-electric converting means for opto-electrically converting the light beam from said magnetic thin film in order to obtain a signal corresponding to a presence and/or absence of the Bloch line in a magnetic wall in the magnetic domain, to reproduce the information based on the signal.

26. An apparatus for optically reproducing information in a Bloch line memory in which the information is recorded in a form of a Bloch line that is in a magnetic wall of a stripe magnetic domain in a magnetic thin film, said apparatus comprising:

a magnetostrictive member responsive to magnetization of said stripe magnetic domain;

means for varying an area of said stripe magnetic domain without chopping said stripe magnetic domain in accordance with a presence or absence of said Bloch line at a predetermined position in said magnetic wall; and means for detecting a magnetostriction of said magnetostrictive member in order to generate a signal corresponding to the presence or absence of said Bloch line, thereby reproducing the information based on said signal.

27. An apparatus for reproducing information in a Bloch line memory in which information is recorded in a form of a Bloch line, said Bloch line being formed in a magnetic wall of a stripe magnetic domain in a magnetic thin film, said apparatus comprising:

a magnetostrictive member responsive to magnetization of said stripe magnetic domain;

means for varying an area of said stripe magnetic domain, by applying a magnetic field to the magnetic thin film in a direction perpendicular to a surface of the magnetic thin film; and means for detecting a magnetostriction of said magnetostrictive member in order to generate a signal corresponding to the presence and/or absence of said Bloch line, thereby reproducing the information based on said signal.

* * * * *

UNITED STATES PATENT AND TRADEMARK OFFICE
CERTIFICATE OF CORRECTION

PATENT NO. : 5,086,409
DATED : February 4, 1992
INVENTOR(S) : HITOSHI ODA ET AL.

Page 1 of 3

It is certified that error appears in the above-identified patent and that said Letters Patent is hereby corrected as shown below:

On the title page:

AT [56] REFERENCES CITED

Other Publications, "MAg-19," should read --MAG-19,--.

AT [57] ABSTRACT

Line 4, "capabable" should read --capable--.

COLUMN 1

Line 17, "winchester" should read --Winchester--.

COLUMN 3

Line 15, "domain 31," should read --domain 3,--.
Line 50, "of" (second occurrence) should be deleted.
Line 63, "there" should be deleted.
Line 66, "such as" should read --using--.

COLUMN 4

Line 40, "diagarm" should read --diagram--.

COLUMN 5

Line 64, "the" (third occurrence) should be deleted.

COLUMN 6

Line 45, "Temperature" should read --The temperature--.

UNITED STATES PATENT AND TRADEMARK OFFICE
CERTIFICATE OF CORRECTION

PATENT NO. : 5,086,409
DATED : February 4, 1992
INVENTOR(S) : HITOSHI ODA ET AL.                 Page 2 of 3

It is certified that error appears in the above-identified patent and that said Letters Patent is hereby corrected as shown below:

COLUMN 7

Line 54, "of" (second occurrence) should read --to--.

COLUMN 8

Line 46, "charactersitics" should read --characteristics--.

COLUMN 9

Line 23, "walls 7" should read --walls 7,--.

COLUMN 10

Line 22, "domains 3" should read --domain 3--.
Line 25, "domains 3" should read --domain 3--.
Line 28, "domains 3 and 3." should read --domain 3--.
Line 31, "the" should read --the other--.
Line 45, "the" (first occurrence) should read --one--.
Line 49, "the" (second occurrence) should read --the other--.
Line 58, "or 3" should be deleted.
Line 67, "or 3" should be deleted.

COLUMN 11

Line 53, "3 or 3." should read --3.--.
Line 56, "31 or 32" should read --3--.

UNITED STATES PATENT AND TRADEMARK OFFICE
CERTIFICATE OF CORRECTION

PATENT NO. : 5,086,409
DATED : February 4, 1992
INVENTOR(S) : HITOSHI ODA ET AL.

It is certified that error appears in the above-identified patent and that said Letters Patent is hereby corrected as shown below:

COLUMN 12

Line 43, "by a" should be deleted.

Signed and Sealed this

Sixth Day of July, 1993

Attest:

MICHAEL K. KIRK

Attesting Officer        Acting Commissioner of Patents and Trademarks